United States Patent
Song

[11] Patent Number: 6,156,605
[45] Date of Patent: Dec. 5, 2000

[54] METHOD OF FABRICATING DRAM DEVICE

[75] Inventor: Jai-Hyuk Song, Seoul, Rep. of Korea

[73] Assignee: Samsung Electronics, Co., Ltd., Suwon, Rep. of Korea

[21] Appl. No.: 09/370,936

[22] Filed: Aug. 9, 1999

[30] Foreign Application Priority Data

Aug. 7, 1998 [KR] Rep. of Korea ............... 98-32235

[51] Int. Cl.$^7$ ............................................. H01L 21/8242
[52] U.S. Cl. ................................ 438/241; 438/275
[58] Field of Search ........................... 438/210, 241, 438/253, 275, 396

[56] References Cited

U.S. PATENT DOCUMENTS

| | | | |
|---|---|---|---|
| 4,417,325 | 11/1983 | Harari | 438/241 |
| 5,045,966 | 9/1991 | Alter | 438/251 |
| 5,320,976 | 6/1994 | Chin et al. | 438/241 |
| 5,792,682 | 8/1998 | McAdams et al. | 438/241 |

Primary Examiner—Chandra Chaudhari
Attorney, Agent, or Firm—Marger Johnson & McCollom, P.C.

[57] ABSTRACT

A DRAM device having a triple well structure and a manufacturing method of the device are disclosed. The DRAM device includes first and second well regions of a first conductivity type formed in a semiconductor substrate of the first conductivity type. The first and second well regions are spaced apart from each other. The DRAM device also includes a third well region of a second conductivity type formed in the semiconductor substrate to encapsulate one of the first and second well regions for electrically isolating the encapsulated region from the semiconductor substrate. At least one first MOS transistor and at least one memory cell are formed in one of the first and second well regions. At least one second MOS transistor is formed in the other of the first and second well regions. In the present invention, one of the first and second MOS transistors has a gate length less than the gate length of the other.

4 Claims, 9 Drawing Sheets

METHOD OF FABRICATING DRAM DEVICE

BACKGROUND OF THE INVENTION

1. Field of the Invention

The present invention relates to a semiconductor memory device and, more particularly, to a method of fabricating DRAM device.

2. Background of the Invention

In a DRAM device, in which an NMOS device with a low threshold voltage is adopted with a triple-well structure, two different kinds of transistors are additionally required, as compared with a device with a twin-well structure, as shown in a table below.

TABLE

| | NMOS (VBB = 0V) | LVTN (VBB = 0V) | NMOS (VBB = -1V) | LVTN (VBB = -1V) | PMOS (VBB = 0V) | Cell TR (VBB = -1V) |
|---|---|---|---|---|---|---|
| Twin-well | X | X | o | o | o | o |
| Triple-well | o | o | o | o | o | o |

As can be seen from the above table, in a twin-well structure, the P well is not isolated from the semiconductor substrate by a deep N well. Therefore, a well bias voltage is the same as that of the cell transistor. In a triple-well structure as shown in FIG. 1, a peripheral well (the semiconductor substrate 100) and a pocket well 140 are isolated from each other. Consequently, the well bias can be set differently. In the triple well structure, the pocket well includes a cell transistor improving the refresh characteristics, while the peripheral well improves the short channel effect. By adding the pocket P-well and the peripheral well to the triple-well structure, the threshold voltage for every transistor has to be separately adjusted. As a result, an additional photolithographic process for ion implantation is required. Such an additional process, however, increases the DRAM manufacturing cost.

SUMMARY OF THE INVENTION

The present invention was made in view of the above-mentioned descriptions and the present invention is directed toward providing a DRAM device with a triple-well structure.

It is a feature of the present invention that a threshold voltage of each transistors formed in each well can be adjusted without an additional photolithographic process for implantation by the way of forming transistors of different gate length on each wells using a single photolithographic process.

The threshold voltage of the transistor can be controlled by the gate length. Transistor in one well region has a gate length of less than 90% of the gate length of the transistor in another well region.

In accordance with the present invention, there is provided a DRAM device with a triple well structure. The DRAM device comprising first and second well regions of a first conductivity type formed in a semiconductor substrate of the first conductivity type, said first and second well regions being spaced apart from each other; a third well region of a second conductivity type formed in said semiconductor substrate to encapsulate one of said first and second well regions for electrically isolating said encapsulated region from said semiconductor substrate; at least one first MOS transistor and at least one memory cell formed in one of said first and second well regions; and at least one second MOS transistor formed in the other of said first and second well regions, wherein one of said first and second MOS transistors has a gate length less than the gate length of the other.

The at least one memory cell includes a transistor and a capacitor.

The first MOS transistor can have a gate length less than 90% of the gate length of the second MOS transistor.

The second MOS transistor can have a gate length less than 90% of the gate length of the first MOS transistor.

In accordance with the present invention, there is provided a method for fabricating a DRAM device. The method comprises providing a semiconductor substrate having first and second well regions of a first conductivity type and a third well region of a second conductivity type, said first and second well regions being isolated from each other by said third well region; forming spaced apart source/drain regions on both said first and second well regions in order that a distance between source/drain regions of one well region is less than the other well region; and forming a gate electrode on both said first and second well regions between said spaced apart source/drain regions, whereby a threshold voltage is controlled by setting the distance between said source/drain regions in said first well region differently from the corresponding distance of said second well region.

In the above method, forming spaced apart source/drain regions on both the first and second well regions comprises forming a mask pattern on said semiconductor substrate to expose selected portions of said first and second well regions where said source/drain regions are to be formed; and implanting impurity ions into exposed said first and second well regions by said singular mask pattern concurrently to form said source/drain regions on both said first and second well regions.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Figure 5:
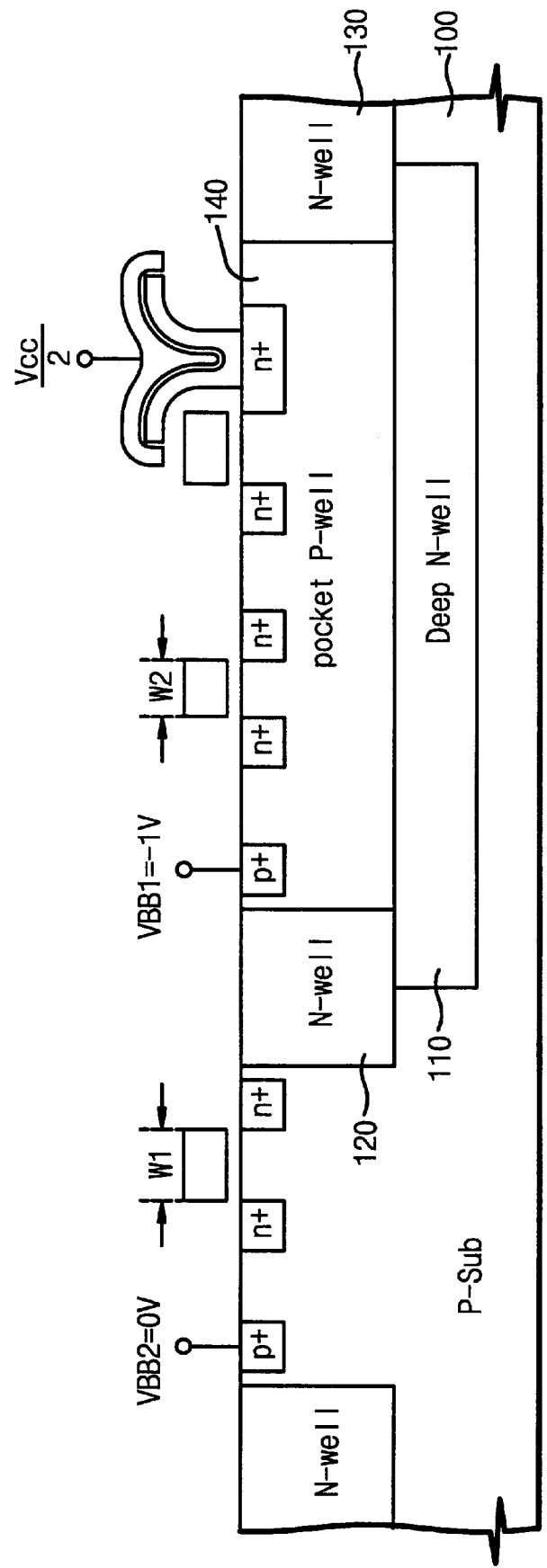
FIGS. 5 and 6 are sectional views of the DRAM with a triple-well structure according to the present invention.

Referring to FIG. 5, in a DRAM having a triple-well structure, a pocket P-well 140 is isolated from a semiconductor substrate (peripheral P-well) 100 by a deep N-well 110 and N-wells 120 and 130. Since the pocket P-well 140 is isolated from the semiconductor substrate (the peripheral P-well) 100 by deep N-well 110, well bias voltages VBB1 and VBB2 can be independently supplied. A VBB generator (back-gate voltage generator) generating well bias voltages supplies a voltage to the silicon substrate. A gate length W2 of an NMOS transistor formed in the pocket P-well 140 is about 90% of a gate length W1 of an NMOS transistor formed in the peripheral P-well (P-substrate 100).

Figure 6:
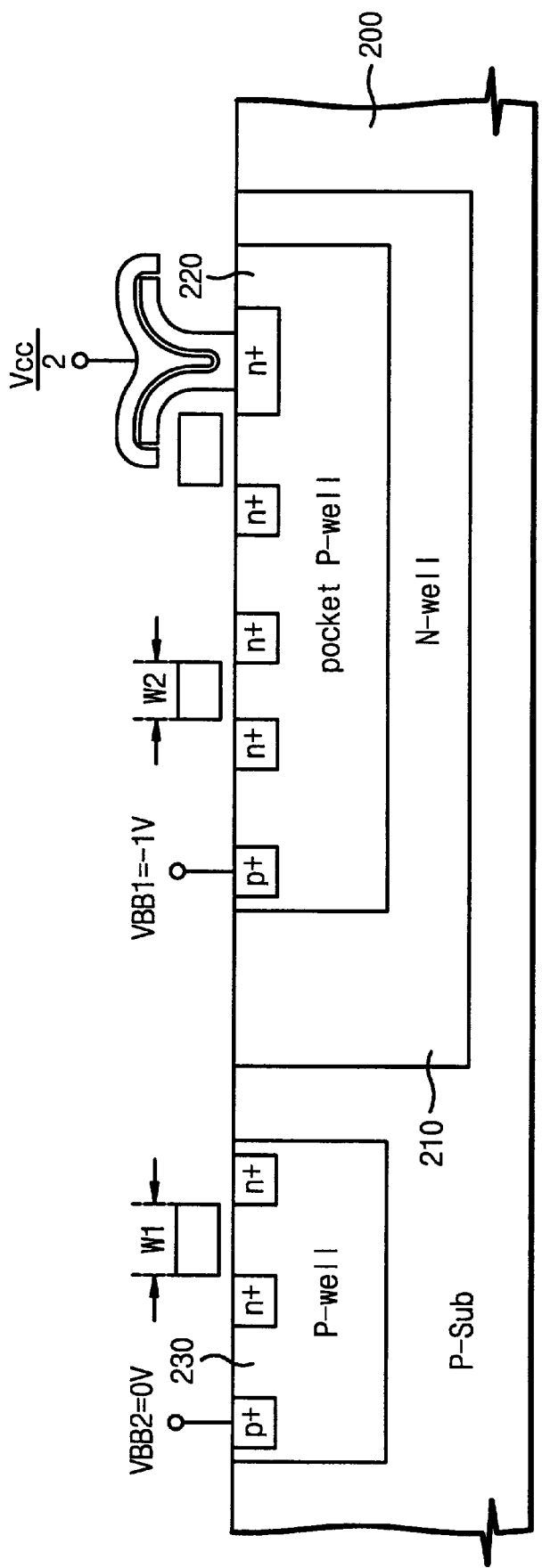

Turning to FIG. 6, a pocket P-well 220 and a peripheral P-well 230 are isolated from each other like in FIG. 5. Both wells are formed in a semiconductor substrate 200. Well bias voltages are independently supplied to the pocket P-well 220 and the peripheral P-well 230, respectively. Under this condition, a gate length W2 of an NMOS transistor formed in the pocket well 220 is about 90% of a gate length W1 of an NMOS transistor formed in the peripheral P-well 230.

FIGS. 7A to 7D illustrate the fabricating process for the DRAM according to the present invention.

Figure 7A:
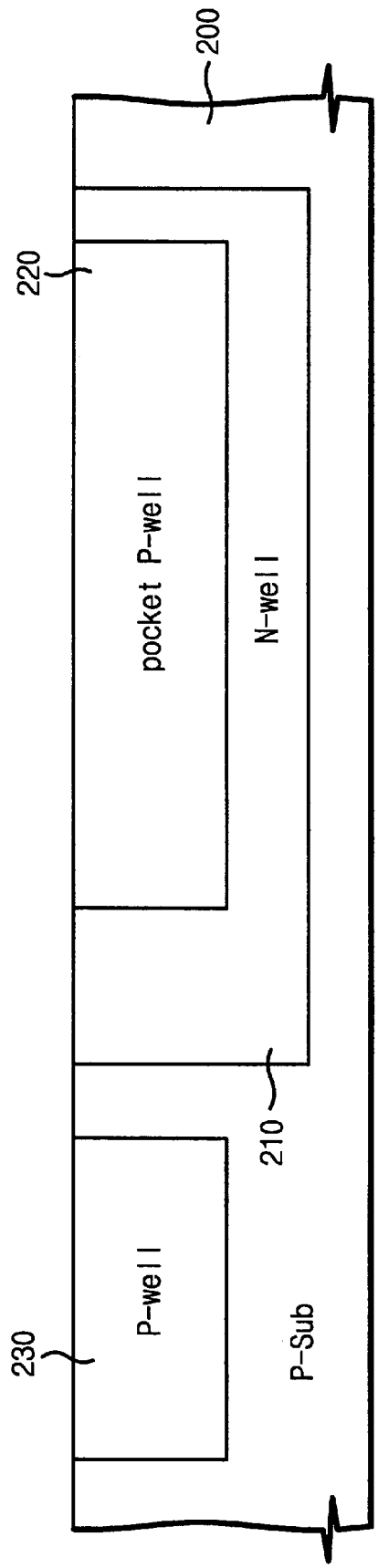
FIGS. 7A to 7D illustrate the fabricating processes for the DRAM according to the present invention.

Now turning to FIG. 7A, an N-well 210 is formed in the semiconductor substrate 200. P-wells 230 and 220, isolated from each other by N-well 210, are formed in the semiconductor substrate 200 and in the N-well 210, respectively.

Figure 7B:
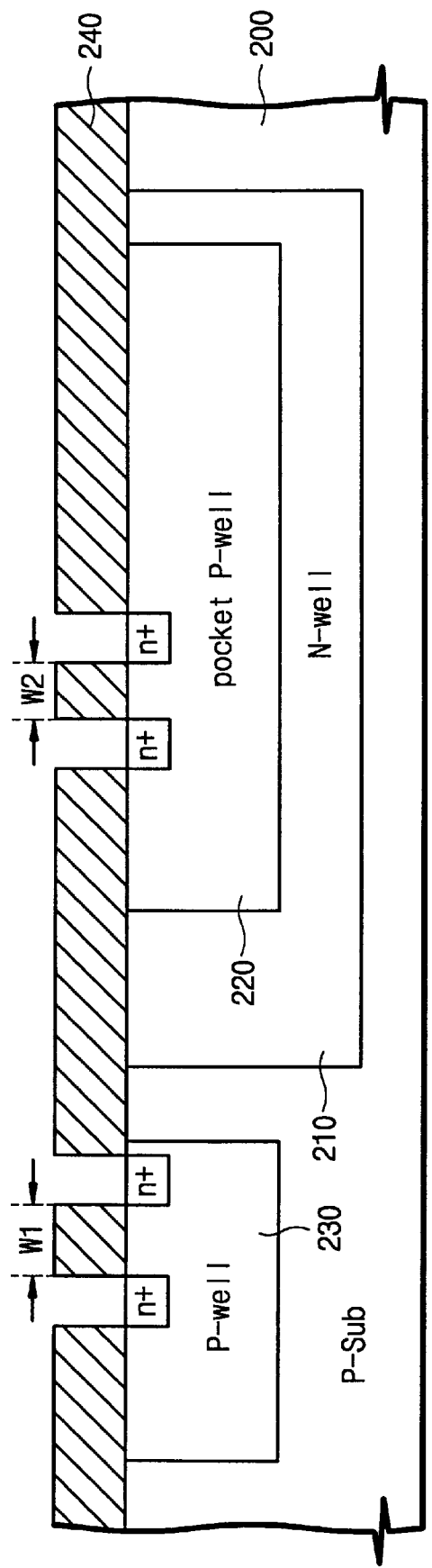

Referring to FIG. 7B, a mask layer 240, having patterns for forming the source/drain regions of MOS transistors in the P-wells, is formed on the semiconductor substrate 200. A pattern width W2 for the P-well 220 is smaller than a pattern width W1 for the P-well 230.

Figure 7C:
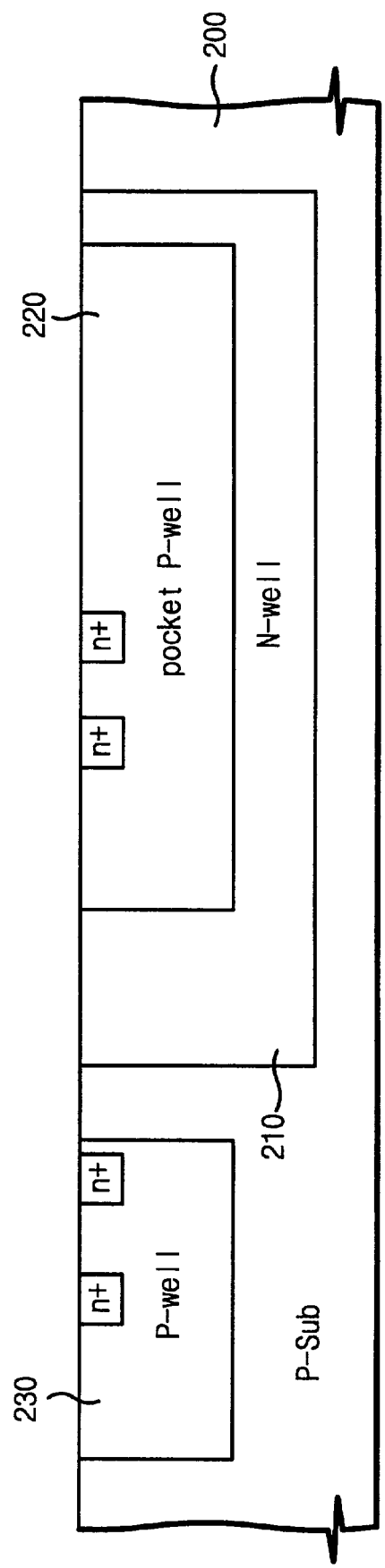
Figure 7D:
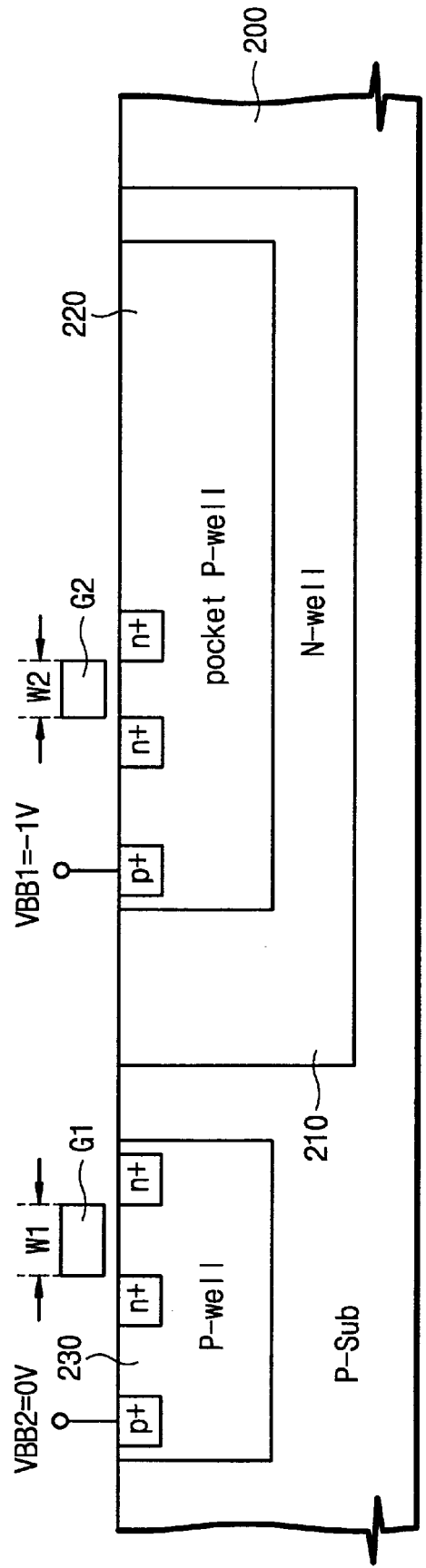

Referring to FIG. 7C, source/drain regions (n⁺ regions) are formed in the P-well by using the mask layer. The mask layer is then removed. Finally, gate electrodes G1 and G2 are formed between the source/drain regions as shown in FIG. 7D. In the DRAM structure as described above, the bias voltages VBB are supplied to the respective wells to obtain the following advantages.

First, the partial forward biasing of the PN junction of the DRAM chip can be prevented. Therefore, the data loss within the memory cells or the latch-up phenomenon can be prevented. Further, the fluctuations of the threshold voltage of the MOS transistor, which are due to a body effect or a back gate effect, can be inhibited. As a result, the circuit can be operated in a stable manner. Also, since the threshold voltage of the parasitic MOS transistor is raised, there is no need to raise the implantation concentration for the channel stop under the field oxide layer, thereby preventing the leakage current flow.

The DRAM cell requires a cell transistor having a relatively high threshold voltage for maintaining the refresh characteristics. However, since the ion implantation dosage is not sufficient to adjust the high threshold voltage, a well bias voltage of −1 V (VBB) has to be supplied to the DRAM cell array region. Therefore, in a DRAM having the pocket P-well, the peripheral P-well can be supplied with a well bias voltage (VBB1=o V) different from the level of the bias voltage of −1 V(VBB2) which is supplied to the pocket P-well. Referring to FIG. 5, the pocket P-well 140 is surrounded by the N-wells 120 and 130, while the deep N-well 110 is formed under it. Outside the N-wells on the semiconductor substrate, there is formed a peripheral P-well 100.

Conventionally, when the well bias voltages are set to −1 V and 0 V, the MOS transistor can decrease the short channel effect. For this reason, VBB1=−1V is supplied to the pocket P-well, while VBB2=0V is supplied to the peripheral P-well. In order to fabricate a transistor in which VBB1=−1V and VBB2=0V, a photolithographic process for ion implantation is carried out. For example, in order to meet the target threshold voltage 0.6V, the NMOS transistor of the pocket P-well is subjected to an ion implantation for a threshold voltage of 1V, while the NMOS transistor of the peripheral P-well is subjected to an ion implantation for a threshold voltage of 1.5V. These additional ion implantation processes have to be accompanied by an addition of a reticle, increasing the fabricating cost.

In the present invention, when a transistor requiring mutually different well bias voltages is fabricated, the DRAM with a triple-well structure can be fabricated without employing such an additional photolithographic process. If a target level of a threshold voltage is set at a VBB2=0V NMOS transistor, then the threshold voltage of a VBB1=−1V NMOS transistor becomes higher. If the threshold voltage becomes higher, the current driving capability is lowered, although the punch-through is reduced. However, this problem can be solved by making the gate length of the VBB1=−1V NMOS transistor of the pocket P-well become smaller than the gate length of the VBB2=0V NMOS transistor of the peripheral P-well.

Figure 1:
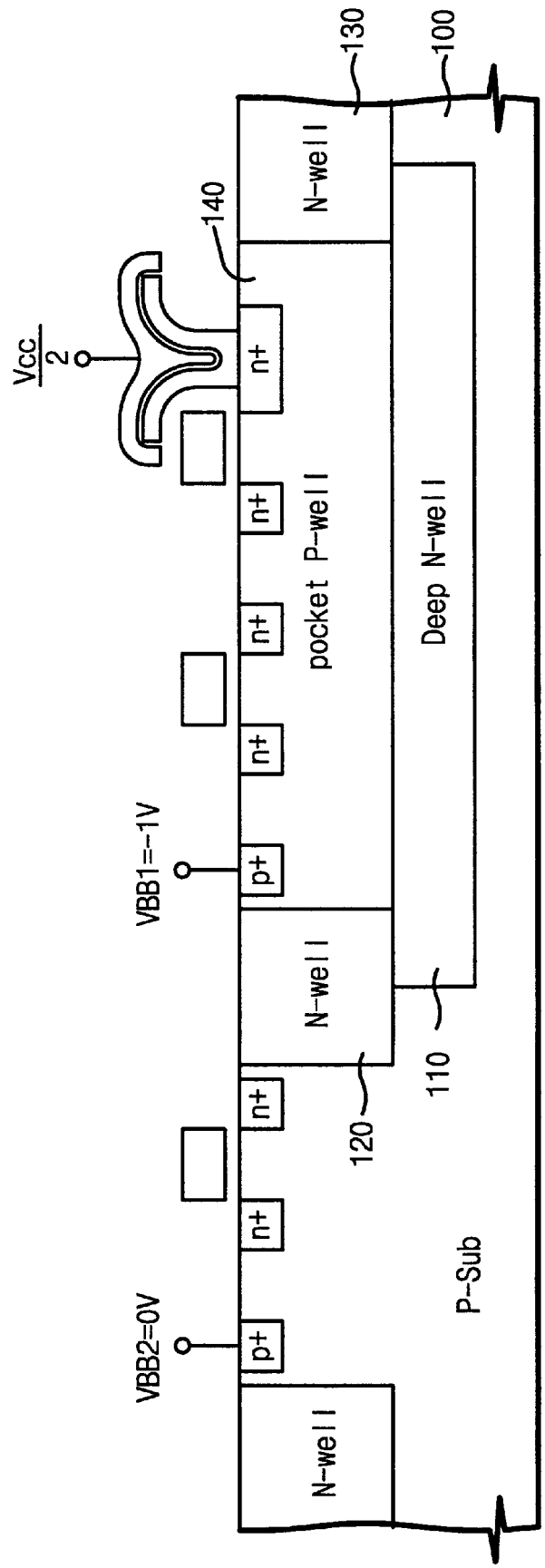
FIG. 1 is a sectional view of a DRAM with a triple-well structure.
Figure 2:
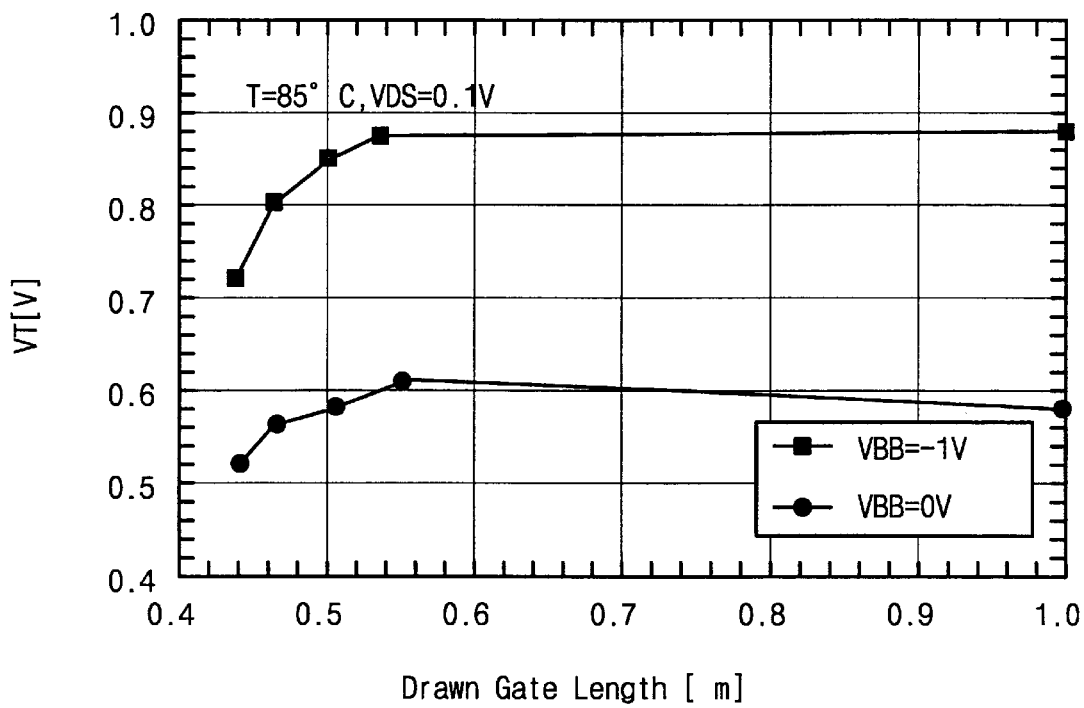
FIG. 2 is a graphical illustration showing the threshold voltage of an NMOS device versus the gate ratio.
Figure 3:
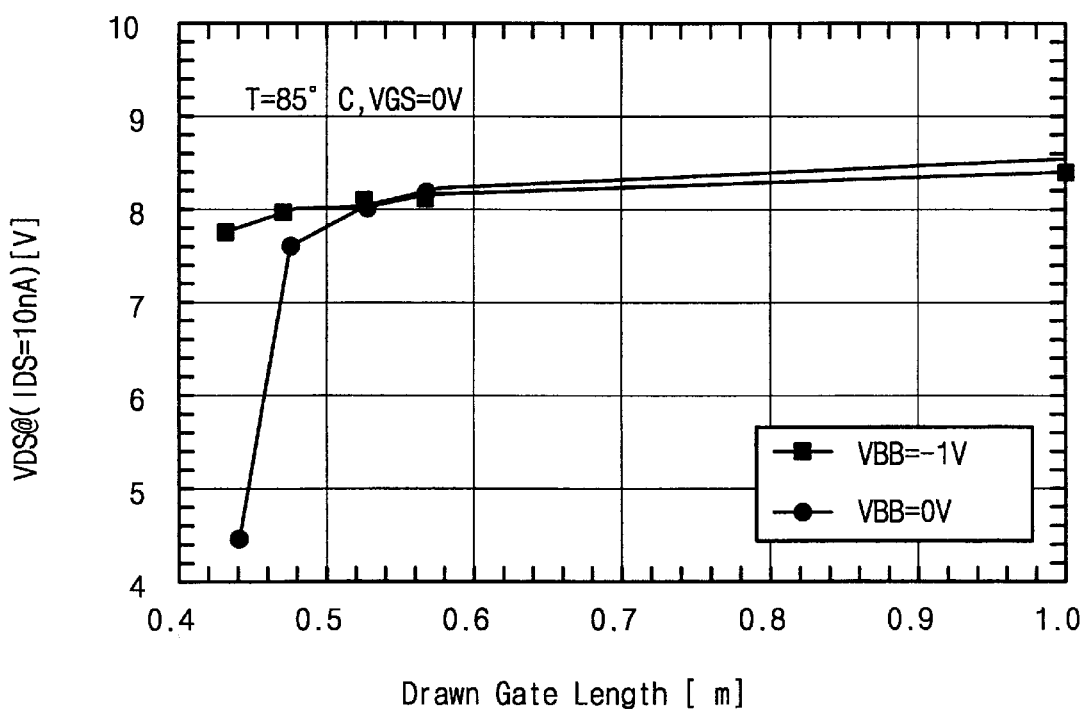
FIG. 3 is a graphical illustration showing a punch-through phenomenon of an NMOS device versus the gate ratio.
Figure 4:
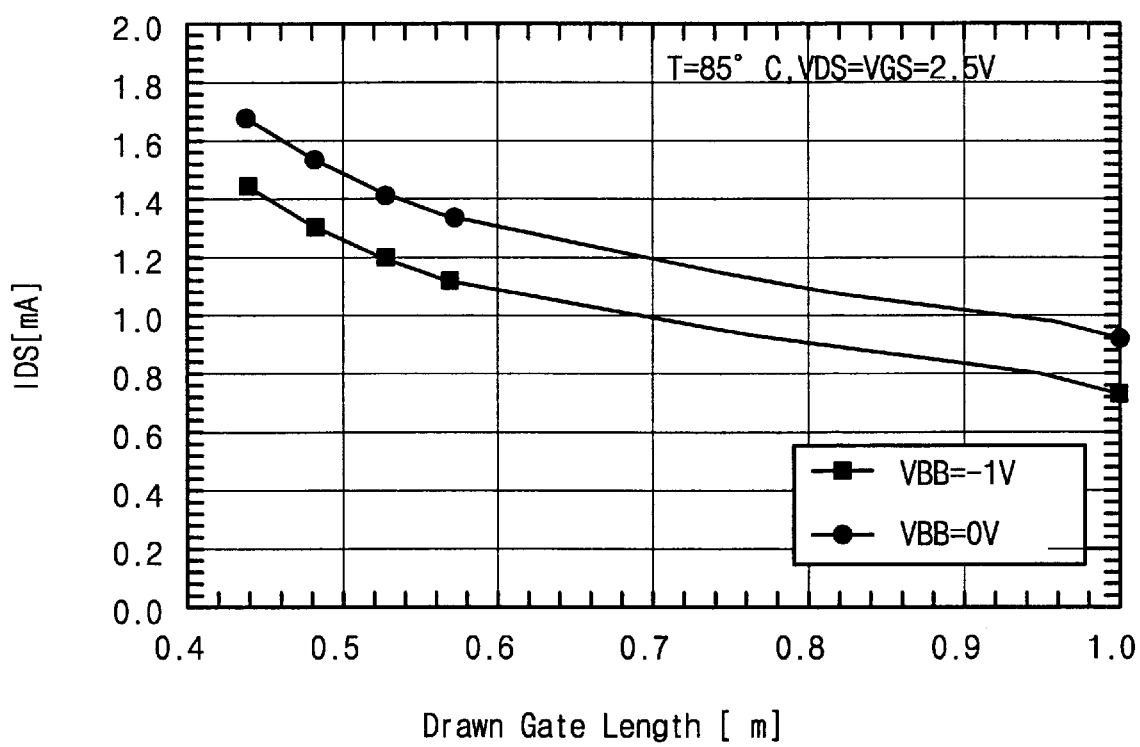
FIG. 4 is a graphical illustration showing the flow of the drain current of an NMOS device versus the gate ratio.

Referring to FIG. 2, when the gate length of the NMOS transistor in the pocket P-well and the gate length of the NMOS transistor in the peripheral P-well are formed to the same length of 0.52 μm, the threshold voltage of the VBB1=−1V NMOS transistor becomes higher by 0.25 V compared with that of the VBB2=0V NMOS transistor. The drain current is also decreased by about 1.2 mA, i.e., 15%. If the gate length of the VBB1=−1V NMOS transistor of the pocket P-well is formed to be 0.44 μm, the threshold voltage of the VBB1=−1V NMOS transistor is increased by 0.12 V compared with that of the VBB2=0V NMOS transistor. Almost the same amount of the drain current flows as is apparent from FIG. 4. Under this condition, since the gate length of the VBB1=−1V NMOS transistor is decreased, the punch-through phenomenon should become more severe. As can be seen in FIG. 3, on the contrary, the punch-through margin becomes same or improved compared with the VBB2=0V NMOS transistor of the peripheral P-well. This is because the threshold voltage of the VBB1=−1V NMOS transistor of the pocket P-well is increased by about 0.12V.

In another case, with a single ion implantation process, the gate length W2 of the NMOS transistor of the pocket P-well is formed to be 0.29 μm, and the gate length W1 of the NMOS transistor of the peripheral P-well is formed to be 0.34 μm. In this instance, although the drain currents of the two transistors are the same, the memory cell has a higher threshold voltage compared with the surrounding circuit regions, and therefore, the refresh characteristics are improved. Further, if the gate length of the NMOS transistor of the pocket P-well is made to be 0.15 μm, and the gate length of the NMOS transistor of the peripheral P-well is formed to be 0.18 μm, the same effect can be achieved.

In the present invention, if the gate length of the NMOS transistor of the pocket P-well is less than about 90% of the gate length of the NMOS transistor of the peripheral P-well, then the DRAM with a triple well structure can be fabricated without an additional photolithographic process. Alternately, if the gate length of the NMOS transistor of the peripheral P-well is less than about 90% of the gate length of the NMOS transistor of the pocket P-well, then the threshold voltage can be adjusted without an additional photolithographic process.

Therefore, the present invention DRAM device having a triple-well structure can be fabricated only by adjusting the gate length without an additional photolithographic process.

What is claimed is:

1. A method for fabricating a DRAM device with a triple well structure, comprising:

providing a semiconductor substrate of a first conductive type, the substrate having first and second well regions of a first conductivity type and a third well region of a second conductivity type, said first and second well regions being electrically isolated from each other by said third well region;

forming spaced apart source/drain regions on both said first and second well regions in order that a distance between source/drain regions of one well region is less than a distance between source/drain regions of the other well region by a predefined amount; and forming a gate electrode on each of said first and second well regions between said corresponding spaced apart source/drain regions, whereby a threshold voltage is controlled by setting the distance between said source/drain regions in said first well region predefinedly differently from the corresponding distance in said second well region.

2. The method according to claim 1, wherein the distance between said source/drain regions in said first well region is less than approximately 90% of the distance between said source/drain regions in said second well region.

3. The method according to claim 1, wherein the distance between said source/drain regions in said second well region is less than approximately 90% of the distance between source/drain regions in said first well region.

4. The method according to claim 1, wherein said step of forming said source/drain regions on each of said first and second well regions comprises:

forming a mask pattern on said semiconductor substrate to expose selected portions of said first and second well regions where said source/drain regions are to be formed; and implanting impurity ions into said exposed selected portions of said first and second well regions by said mask pattern to form said source/drain regions on both said first and second well regions, wherein said implanting into said first and second well regions is performed concurrently using the same singular mask pattern.

* * * * *